(12) United States Patent
Yamamoto et al.

(10) Patent No.: US 8,835,911 B2
(45) Date of Patent: *Sep. 16, 2014

(54) LIGHT EMITTING ELEMENT, LIGHT EMITTING DEVICE, DISPLAY, AND ELECTRONIC DEVICE

(75) Inventors: Hidetoshi Yamamoto, Suwa (JP); Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 271 days.

This patent is subject to a terminal disclaimer.

(21) Appl. No.: 13/407,152

(22) Filed: Feb. 28, 2012

(65) Prior Publication Data

US 2012/0223341 A1 Sep. 6, 2012

(30) Foreign Application Priority Data

Mar. 4, 2011 (JP) ................................. 2011-047272

(51) Int. Cl.
*H01L 51/54* (2006.01)
*H01L 51/50* (2006.01)

(52) U.S. Cl.
CPC ......... *H01L 51/5088* (2013.01); *H01L 2251/55* (2013.01); *H01L 51/5056* (2013.01); *H01L 51/5084* (2013.01); *H01L 2251/558* (2013.01)
USPC ............. 257/40; 257/E51.019; 257/E51.022; 257/E51.026

(58) Field of Classification Search
CPC ..... H01L 51/50; H01L 51/56; H01L 51/5064; H01L 51/5088
USPC ............. 257/40, E51.019, E51.022, E51.026
See application file for complete search history.

(56) References Cited

U.S. PATENT DOCUMENTS

| 5,955,836 A | 9/1999 | Boerner et al. |
| 5,989,737 A | 11/1999 | Xie et al. |
| 6,171,715 B1 | 1/2001 | Sato et al. |
| 6,344,283 B1 | 2/2002 | Inoue et al. |
| 6,387,546 B1 | 5/2002 | Hamada et al. |
| 6,831,406 B1 | 12/2004 | Fukuyama et al. |
| 2002/0015859 A1 | 2/2002 | Watanabe et al. |
| 2002/0022149 A1 | 2/2002 | Watanabe et al. |
| 2002/0086180 A1 | 7/2002 | Seo et al. |
| 2006/0292394 A1 | 12/2006 | Iwaki et al. |
| 2007/0172700 A1 | 7/2007 | Nishita |
| 2010/0140645 A1* | 6/2010 | Shibata ........................... 257/98 |

FOREIGN PATENT DOCUMENTS

| JP | A-05-182762 | 7/1993 |
| JP | A-10-106748 | 4/1998 |
| JP | A-10-255985 | 9/1998 |
| JP | A-11-097177 | 4/1999 |
| JP | A-11-345686 | 12/1999 |

(Continued)

*Primary Examiner* — Minchul Yang
(74) *Attorney, Agent, or Firm* — Oliff PLC

(57) ABSTRACT

A light emitting element has an anode, a cathode, a light emitting layer which is provided between the anode and the cathode and emits light by energizing the anode and the cathode, and a functional layer (a hole injecting layer and a hole transporting layer) which is provided between the anode and the light emitting layer in contact therewith and has a function of transporting a hole, in which the hole injecting layer and the hole transporting layer each are constituted including an electron transporting material having electron transporting properties. The content of the electron transporting material contained in the hole injecting layer and the content thereof contained in the hole transporting layer are different from each other.

20 Claims, 5 Drawing Sheets

(56) References Cited

FOREIGN PATENT DOCUMENTS

| | | |
|---|---|---|
| JP | A-2000-323281 | 11/2000 |
| JP | A-2000-340361 | 12/2000 |
| JP | A-2001-284056 | 10/2001 |
| JP | A-2001-313177 | 11/2001 |
| JP | A-2002-313583 | 10/2002 |
| JP | A-2003-077676 | 3/2003 |
| JP | B2-3654909 | 6/2005 |
| JP | A-2007-142011 | 6/2007 |
| JP | A-2007-200938 | 8/2007 |
| JP | A-2008-021665 | 1/2008 |
| JP | A-2009-158756 | 7/2009 |

* cited by examiner

FIG. 6

| | HOLE INJECTING LAYER | | | | HOLE TRANSPORTING LAYER | | | | EVALUATION | | | |
|---|---|---|---|---|---|---|---|---|---|---|---|---|
| | CONSTITUENT MATERIAL | | AVERAGE THICKNESS [nm] | | CONSTITUENT MATERIAL | | AVERAGE THICKNESS [nm] | DRIVE VOLTAGE [V] | CURRENT DENSITY [mA/cm²] | CHROMATICITY (x, y) | LIFETIME (LT90) STANDARDIZED IN COMPARATIVE EXAMPLE |
| | HOLE INJECTING MATERIAL AND CONTENT [wt%] | ELECTRON TRANSPORTING MATERIAL AND CONTENT [wt%] | | | HOLE TRANSPORTING MATERIAL AND CONTENT [wt%] | ELECTRON TRANSPORTING MATERIAL AND CONTENT [wt%] | | | | | | |
| EXAMPLE 1 | FORMULA (1) 60 | FORMULA (10) 40 | 50 | | FORMULA (2) 40 | FORMULA (10) 60 | 20 | 9.8 | 1250 | (0.63, 0.32) | 3.4 |
| EXAMPLE 2 | FORMULA (1) 50 | FORMULA (10) 50 | 50 | | FORMULA (2) 40 | FORMULA (10) 60 | 20 | 10.0 | 1280 | (0.66, 0.33) | 3.5 |
| EXAMPLE 3 | FORMULA (1) 70 | FORMULA (10) 30 | 50 | | FORMULA (2) 40 | FORMULA (10) 60 | 20 | 9.6 | 1240 | (0.67, 0.33) | 2.9 |
| EXAMPLE 4 | FORMULA (1) 60 | FORMULA (10) 40 | 50 | | FORMULA (2) 30 | FORMULA (10) 70 | 20 | 10.0 | 1290 | (0.67, 0.33) | 3.65 |
| EXAMPLE 5 | FORMULA (1) 60 | FORMULA (10) 40 | 20 | | FORMULA (2) 40 | FORMULA (10) 60 | 50 | 10.4 | 1300 | (0.67, 0.33) | 3.5 |
| EXAMPLE 6 | FORMULA (2) 60 | FORMULA (10) 40 | 50 | | FORMULA (2) 40 | FORMULA (10) 60 | 20 | 9.6 | 1250 | (0.67, 0.33) | 3.55 |
| COMPARATIVE EXAMPLE | FORMULA (1) 100 | — 0 | 50 | | FORMULA (2) 100 | — 0 | 20 | 9.4 | 1190 | (0.67, 0.33) | 1.0 |

LIGHT EMITTING ELEMENT, LIGHT EMITTING DEVICE, DISPLAY, AND ELECTRONIC DEVICE

BACKGROUND

1. Technical Field

The present invention relates to a light emitting element, a light emitting device, a display device, and an electronic device using the light emitting element.

2. Related Art

Organic electroluminescence elements (so-called organic EL elements) are light emitting elements each having a structure in which at least one light emitting organic layer is disposed as a light emitting layer between an anode and a cathode. In such a light emitting element, by applying an electric field between the cathode and the anode, electrons are injected into the light emitting layer from the cathode side and also holes are injected thereinto from the anode side, so that the electrons and the holes are recombined in the light emitting layer to generate excitons, and when the excitons return to the ground state, the energy of the excitons is emitted as light.

In such a light emitting element, a hole injecting layer and a hole transporting layer are generally provided between the anode and the light emitting layer in order to increase the injection properties and the transporting properties of the holes (e.g., Japanese Patent No. 3654909).

Moreover, in such a light emitting element, the electrons from the cathode side (light emitting layer side) are blocked by the hole transporting layer by adjusting the size of HOMO (highest occupied molecular orbital) and LUMO (lowest unoccupied molecular orbital) of the hole transporting layer to confine the electrons and the hole in the light emitting layer, thereby increasing the light emitting efficiency.

However, in the former light emitting elements, the hole transporting layer has not been able to sufficiently block the electrons from the cathode side, which has caused a problem that the hole transporting layer or the hole injecting layer has been deteriorated due to prolonged use by the electrons which have entered and passed through the hole transporting layer. Such a problem becomes remarkable with an increase in a drive voltage (with an increase in a current density), because the function of blocking the electrons of the hole transporting layer decreases due to the band bending effect. Therefore, in a high-intensity light emitting element requiring a high-density current, it has been difficult to achieve an extension of the lifetime.

In order to increase the electron blocking effect, there is a possibility of using a material with a large energy gap between HOMO and LUMO for the hole transporting layer. However, there has been a problem that since the types of materials usable as the hole transporting layer are limited, the materials have been difficult to actually use.

SUMMARY

The invention has been made in order to at least partially solve the above-described problems, and can be realized as the following aspects or application examples.

Application Example 1

A light emitting element of this application example has an anode, a cathode, and a light emitting layer provided between the anode and the cathode; and an organic layer which is provided between the anode and the light emitting layer and has a function of transporting a hole, in which the organic layer has a hole injecting layer which is provided in contact with the anode and contains a hole injecting material and a hole transporting layer which is provided in contact with the hole injecting layer and the light emitting layer and contains a hole transporting material, the hole injecting layer and the hole transporting layer each contain an electron transporting material having electron transporting properties, and the content of the electron transporting material is different between the hole injecting layer and the hole transporting layer.

According to the light emitting element of this application example, the organic layer having the function of transporting holes can efficiently transport holes to the light emitting layer from the anode. Therefore, the light emitting efficiency of the light emitting element can be increased.

In particular, in the light emitting element of this application example, the organic layer contains an electron transporting material and is in contact with each of the anode and the light emitting layer. Therefore, even when electrons enter (are injected into) the organic layer from the light emitting layer, the organic layer can promptly transport the electrons to the anode side and pass the same. Thus, the electrons can be prevented from staying in the organic layer, and as a result the organic layer can be prevented from being deteriorated by the electrons. Therefore, even when driving at a current having a high current density, the extension of the lifetime of the light emitting element can be achieved. Moreover, by differentiating the mixing ratio of the electron transporting material between the hole injecting layer and the hole transporting layer between the hole injecting layer and the hole transporting layer, the light emission properties and the lifetime characteristics can be suitably balanced.

Application Example 2

In the light emitting element of the application example above, the organic layer has a function of blocking electrons.

Thus, the organic layer can block the electrons from the light emitting layer while transporting holes to the light emitting layer from the anode. Therefore, the electrons and the holes can be efficiently confined in the light emitting layer to thereby increase the light emitting efficiency.

Thus, even when the organic layer has a function of blocking electrons, the organic layer cannot completely block electrons when driving at a high current density, and, as a result, electrons enter (are injected into) the organic layer in some cases. Also in such a case, in the light emitting element of this application example, the organic layer contains an electron transporting material, and therefore the organic layer can promptly transport the electrons, which cannot be completely blocked by the organic layer and enter the organic layer, to the anode side and pass the same.

Application Example 3

In the light emitting element of the application example above, the content of the electron transporting material is higher in the hole transporting layer than in the hole injecting layer.

Thus, the transportation of the electrons from the light emitting layer to the hole transporting layer is facilitated, and therefore the extension of the lifetime can be effectively achieved.

Application Example 4

In the light emitting element of the application example above, the film thickness of the hole transporting layer is smaller than the film thickness of the hole injecting layer.

Since the content of the electron transporting material is higher in the hole transporting layer than in the hole injecting layer, the hole mobility becomes low, so that the drive voltage easily increases. Therefore, by reducing the film thickness of the hole transporting layer to be smaller than the film thickness of the hole injecting layer, the increase in the drive voltage can be suppressed as compared with the case where the film thickness of the hole transporting layer is equal to or larger than that of the hole injecting layer.

Application Example 5

In the light emitting element of the application example above, the electron transporting material is an acene-based material.

The acene-based material has excellent electron transporting properties. Therefore, the organic layer containing the acene-based material can promptly transport the electrons from the light emitting layer to the anode. The acene-based material has excellent resistance to electrons. Therefore, the deterioration of the organic layer by electrons can be prevented or suppressed.

Application Example 6

In the light emitting element of the application example above, the organic layer contains an amine-based material.

The amine-based material has excellent hole transporting properties. Therefore, the organic layer containing the amine-based material can promptly transport the holes from the anode to the light emitting layer.

Application Example 7

In the light emitting element of the application example, the organic layer contains a mixed material in which the acene-based material and the amine-based material are mixed.

Thus, the balance of the hole transporting properties and the electron transporting properties of the organic layer can be relatively easily adjusted in a suitable range.

Application Example 8

In the light emitting element of the application example above, the acene-based material contains at least one of anthracene-based materials and naphthacene-based materials.

Such an acene-based material has excellent electron transporting properties and electron resistance and can be relatively easily formed into a film with high film quality.

Application Example 9

In the light emitting element of the application example above, the hole transporting materials contained in the hole injecting layer and the hole transporting layer are the same.

Thus, the deterioration of the hole injecting layer and the hole transporting layer by electrons can be prevented while achieving good hole injection properties and hole transporting properties from the anode.

Application Example 10

In the light emitting element of the application example above, the content of the electron transporting material in the hole injecting layer and the content of the electron transporting material in the hole transporting layer each are 30% by weight or more and 70% by weight or lower.

Thus, the electron transporting properties and hole transporting properties of the organic layer can be suitably balanced. When the organic layer has electron blocking properties, the electron blocking properties and the electron transporting properties of the organic layer can be suitably balanced.

Application Example 11

In the light emitting element of the application example above, the average thickness of the organic layer is 20 nm or more and 100 nm or lower.

Thus, the deterioration of the hole injecting layer and the hole transporting layer by electrons can be prevented while achieving good hole injection properties and hole transporting properties from the anode.

Application Example 12

A light emitting device has the light emitting element of the application example above.

Such a light emitting device has a long-life light emitting element, and thus has excellent reliability.

Application Example 13

A display device has the light emitting device of the application example above.

Such a display device can display a high-definition image over a long period of time and has excellent reliability.

Application Example 14

An electronic device has the display device of the application example above.

Such an electronic device has excellent reliability.

BRIEF DESCRIPTION OF THE DRAWINGS

The invention will be described with reference to the accompanying drawings, wherein like numbers reference like elements.

FIG. 6 is a table showing the structures of hole injecting layers and hole transporting layers in light emitting elements of Examples and Comparative Example and the evaluation results of the light emission properties.

DESCRIPTION OF EXEMPLARY EMBODIMENTS

Hereinafter, a light emitting element, a light emitting device, a display device, and an electronic device are described with reference to suitable embodiments illustrated in the accompanied drawings. In the following drawings, the scale of each layer or each member is differentiated from the actual scale so that each layer or each member can be recognized.

Embodiment 1

Figure 1:
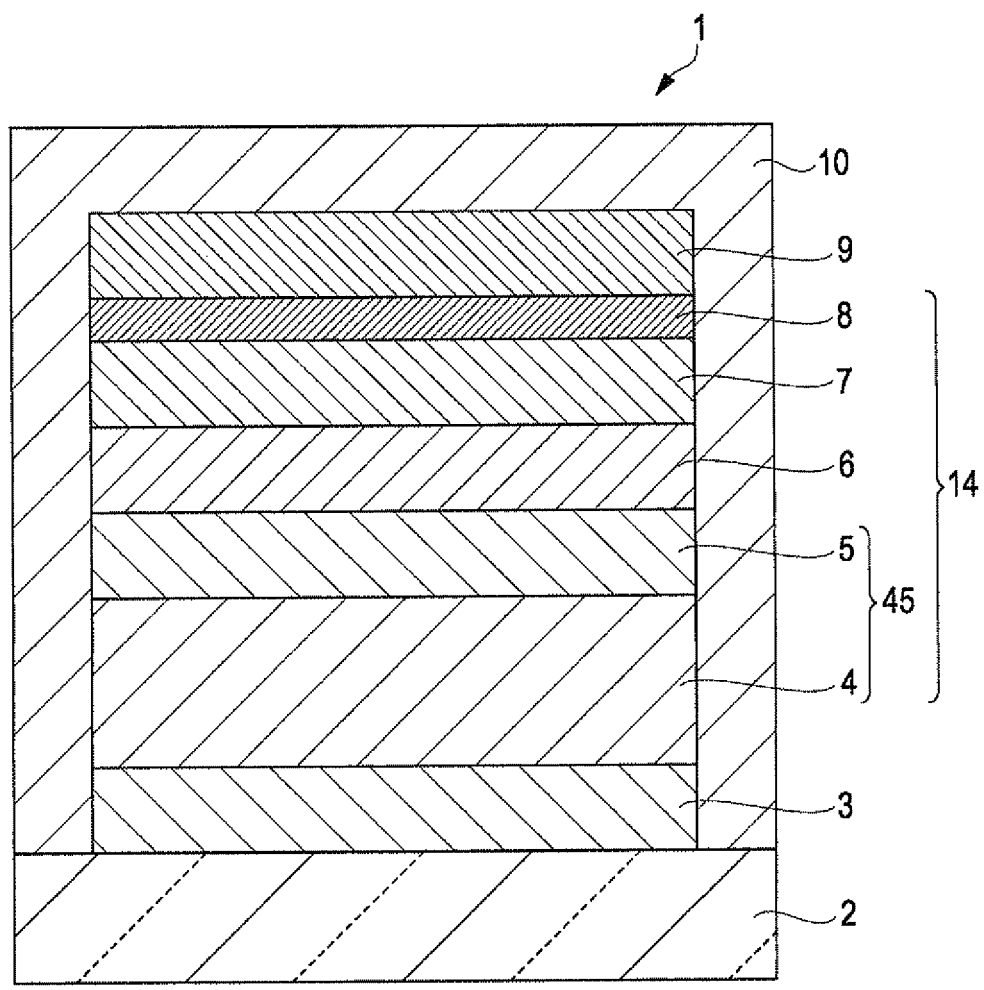
FIG. 1 is a cross sectional view schematically illustrating a light emitting element according to a first embodiment of the invention.

FIG. 1 is a cross sectional view schematically illustrating a light emitting element according to a first embodiment of the invention. The following description is given while defining the upper side of FIG. 1 as "top" and the lower side of FIG. 1 as "bottom" for convenience of explanation.

A light emitting element (electroluminescence element) 1 illustrated in FIG. 1 has a structure in which an anode 3, a hole injecting layer 4, a hole transporting layer 5, a light emitting layer 6, an electron transporting layer 7, an electron injecting layer 8, and a cathode 9 are laminated in this order. More specifically, in the light emitting element 1, a laminate 14 in which the hole injecting layer 4, the hole transporting layer 5, the light emitting layer 6, the electron transporting layer 7, and the electron injecting layer 8 are laminated in this order from the anode 3 side to the cathode 9 side is interposed between the anode 3 and the cathode 9. In this embodiment, a functional layer 45 containing the hole injecting layer 4 and the hole transporting layer 5, an organic layer having a function of transporting holes to the light emitting layer 6 from the anode 3, is constituted.

The entire light emitting element 1 is provided on the substrate 2 and is sealed by a sealing member 10.

In such a light emitting element 1, by applying a drive voltage to the anode 3 and the cathode 9, electrons are supplied (injected) to the light emitting layer 6 from the cathode 9 side and holes are supplied (injected) from the anode 3 side to the light emitting layer 6. In the light emitting layer 6, the holes and the electrons are recombined, and excitons are generated by the energy emitted in the recombination thereof. When the excitons return to the ground state, energy (fluorescence or phosphorescence) is discharged (light emission). Thus, the light emitting element 1 emits light.

In such a case, the functional layer (organic layer) containing the hole injecting layer 4 and the hole transporting layer 5 can efficiently transport holes to the light emitting layer 6 from the anode 3 in the light emitting element 1. Therefore, the light emitting efficiency of the light emitting element 1 can be increased.

In particular, in the light emitting element 1, the functional layer containing the hole injecting layer 4 and the hole transporting layer 5 contains an electron transporting material and is in contact with each of the anode 3 and the light emitting layer 6 as described in detail later. Therefore, even when electrons enter (even when injected into) the hole transporting layer 5 from the light emitting layer 6, the hole injecting layer 4 and the hole transporting layer 5 can promptly transport the electrons to the anode 3 side and pass the same. Thus, the electrons can be prevented from staying in the hole injecting layer 4 and the hole transporting layer 5, and, as a result, the deterioration of the hole injecting layer 4 and the hole transporting layer 5 by the electrons can be prevented. Therefore, even when driving at a current having a high current density, an extension of the lifetime of light emitting element 1 can be achieved. Moreover, by differentiating the mixing ratio of the electron transporting material between the hole injecting layer 4 and the hole transporting layer 5, the light emission properties and the lifetime characteristics can be suitably balanced.

The substrate 2 supports the anode 3. The light emitting element 1 of this embodiment has a structure in which light is extracted from the substrate 2 side (bottom emission type). Therefore, the substrate 2 and the anode 3 each are substantially transparent (colorlessness and transparent, colored and transparent, or translucent).

Mentioned as the constituent material of the substrate 2 are, for example, resin materials, such as polyethylene terephthalate, polyethylene naphthalate, polypropylene, cycloolefin polymer, polyimide, polyethersulfone, polymethyl methacrylate, polycarbonate, and polyarylate, glass materials, such as silica glass and soda glass, and the like. These substances can be used singly or in combination of two or more kinds thereof.

The average thickness of the substrate 2 is not particularly limited and is preferably about 0.1 mm to about 30 mm and more preferably about 0.1 mm to about 10 mm.

In the case of the structure in which the light emitting element 1 extracts light from the side opposite to the substrate 2 (top emission type), any one of a transparent substrate and an opaque substrate can be used for the substrate 2.

Mentioned as the opaque substrate are, for example, a substrate constituted by a ceramic material, such as alumina, one in which an oxide film (insulating film) is formed on the surface of a metal substrate, such as stainless steel, a substrate constituted by a resin material, and the like.

In such a light emitting element 1, the distance between the anode 3 and the cathode 9 (i.e., average thickness of the laminate 14) is preferably 100 nm to 300 nm, more preferably 100 nm to 250 nm, and still more preferably 100 nm to 200 nm. Thus, a reduction in a drive voltage of the light emitting element 1 can be simply and securely achieved.

Hereinafter, each part constituting the light emitting element 1 is described one by one.

Anode

The anode 3 is an electrode for injecting holes into the light emitting layer 6 through the hole injecting layer 4 described later. As the constituent material of the anode 3, a material having a high work function and excellent conductivity is preferably used.

Mentioned as the constituent material of the anode 3 are, for example, oxides, such as ITO (Indium Tin Oxide), IZO (Indium Zinc Oxide), $In_3O_3$, $SnO_2$, Sb containing $SnO_2$, and Al containing ZnO, Au, Pt, Ag, Cu, or alloys containing the same. These substances can be used singly or in combination of two or more kinds thereof.

In particular, the anode 3 is preferably constituted by ITO. The ITO is a material which has transparency, a high work function, and excellent conductivity. Thus, holes can be efficiently injected into the hole injecting layer 4 from the anode 3.

The surface (upper surface in FIG. 1) at the hole injecting layer 4 side of the anode 3 is preferably subjected to plasma treatment. Thus, the chemical and mechanical stability of the bonded surface of the anode 3 and the hole injecting layer 4 can be increased. As a result, the hole injection properties from the anode 3 to the hole injecting layer 4 can be increased. The plasma treatment is described in detail in the description of a method for manufacturing the light emitting element 1 described later.

The average thickness of such an anode 3 is not particularly limited, and is preferably about 10 nm to about 200 nm and more preferably about 50 nm to about 150 nm.

Cathode

In contrast, the cathode 9 is an electrode for injecting electrons into the electron transporting layer 7 through the electron injecting layer 8 described later. As the constituent material of the cathode 9, a material having a low work function is preferably used.

Mentioned as the constituent material of the cathode 9 are, for example, Li, Mg, Ca, Sr, La, Ce, Er, Eu, Sc, Y, Yb, Ag, Cu, Al, Cs, Rb, or alloys containing the same. These substances can be used singly or in combination of two or more kinds thereof (e.g., as a laminate of a plurality of layers, a mixed layer of a plurality of kinds of the substances, etc.).

In particular, when an alloy is used as the constituent material of the cathode 9, it is preferable to use an alloy containing a stable metal element, such as Ag, Al, or Cu, specifically an alloy, such as MgAg, AlLi, or CuLi. By the use of such an alloy as the constituent material of the cathode 9, the electron injecting efficiency and the stability of the cathode 9 can be increased.

The average thickness of such a cathode 9 is not particularly limited and is preferably about 50 nm to about 1000 nm and more preferably about 100 nm to about 500 nm.

The light emitting element 1 of this embodiment is a bottom emission type, and therefore light transmittance is not particularly required in the cathode 9.

Hole Injecting Layer

The hole injecting layer 4 has a function of increasing the hole injecting efficiency from the anode 3 (i.e., having hole injection properties). Moreover, the hole injecting layer 4 also has a function of transporting electrons as described in detail later.

The hole injecting layer 4 contains a material having hole injection properties (i.e., a hole injecting material) and a material having electron transporting properties (i.e., an electron transporting material). The electron transporting material contained in the hole injecting layer 4 is described in detail later with the description of the electron transporting material contained in the hole transporting layer 5.

The hole injecting material contained in the hole injecting layer 4 is not particularly limited and, for example, copper phthalocyanine, 4,4',4''-tris(N,N-phenyl-3-methylphenylamino)triphenylamine (m-MTDATA), N,N'-bis-(4-diphenylamino-phenyl)-N,N'-diphenyl-biphenyl-4-4'-diamine represented by Formula (1), and the like are mentioned.

(1)

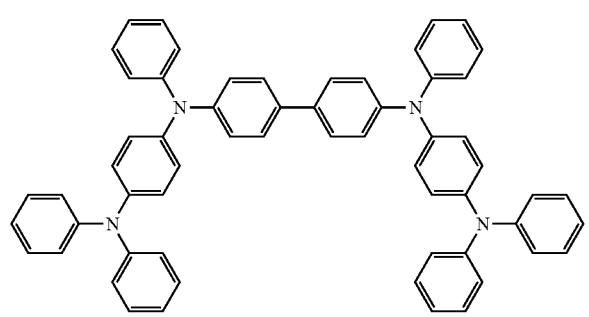

In particular, as the hole injecting material contained in the hole injecting layer 4, amine-based materials are preferably used from the viewpoint of excellent hole injection properties and hole transporting properties, and diamino benzene derivatives, benzidine derivatives (materials having the benzidine skeleton), and triamine based compounds and tetramine compounds having both a "diamino benzen" unit and a "benzidine" unit in the molecules are more preferably used.

The average thickness of such a hole injecting layer 4 is not particularly limited, and is preferably about 5 nm to about 90 nm and more preferably about 10 nm to about 70 nm.

Hole Transporting Layer

The hole transporting layer 5 has a function of transporting the holes injected from the anode 3 through the hole injecting layer 4 to the light emitting layer 6 (i.e., having hole transporting properties). As described in detail later, the hole transporting layer 5 also has a function of transporting electrons.

The hole transporting layer 5 is constituted including a material having hole transporting properties (i.e., hole transporting material) and a material having electron transporting properties (i.e., electron transporting material). The electron transporting material contained in the hole transporting layer 5 is described in detail later with the description of the electron transporting material contained in the hole injecting layer 4.

For the hole transporting material contained in the hole transporting layer 5, various kinds of p-type high-molecular weight materials or various kinds of p-type low-molecular weight materials can be used singly or in combination. For example, tetra-aryl benzidine derivatives, such as N,N'-di(1-naphthyl)-N,N'-diphenyl-1,1'-diphenyl-4,4'-diamine (NPD) and N,N'-diphenyl-N,N'-bis(3-methylphenyl)-1,1'-diphenyl-4,4'-diamine (TPD), represented by Formula (2), a tetra-aryl diamino fluorene compound or a derivative thereof (amine-based compounds) are mentioned. These substances can be used singly or in combination of two or more kinds thereof.

(2)

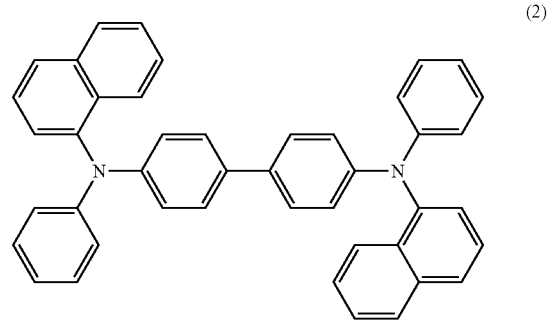 [SMILES: c1ccc(N(c2ccc(-c3ccc(N(c4ccccc4)c4cccc5ccccc45)cc3)cc2)c2cccc3ccccc23)cc1]

In particular, the hole transporting material contained in the hole transporting layer 5 is preferably an amine-based material from the viewpoint of excellent hole injection properties and hole transporting properties and more preferably a benzidine derivative (material having a benzidine skeleton).

As the hole transporting material contained in the hole transporting layer 5, it is also preferable to use one having a band gap (energy difference between the HOMO level and the LUMO level) capable of blocking the electrons from the light emitting layer 6. More specifically, the functional layer 45 containing the hole injecting layer 4 and the hole transporting layer 5 preferably has a function of blocking electrons.

Thus, the electrons from the light emitting layer 6 can be blocked while the hole injecting layer 4 and the hole transporting layer 5 are transporting holes to the light emitting layer 6 from the anode 3. Therefore, electrons and holes can be efficiently confined in the light emitting layer 6, so that the light emitting efficiency can be increased.

Thus, even when the hole transporting layer 5 has a function of blocking electrons, the hole transporting layer 5 cannot completely block electrons when driving at a high current density and, as a result, the electrons enter (are injected into) the hole transporting layer 5 in some cases. Also in this case, in the light emitting element 1, since the hole injecting layer 4 and the hole transporting layer 5 each contain electron transporting materials, the hole injecting layer 4 and the hole transporting layer 5 can promptly transport the electrons, which have entered the hole transporting layer 5 without being blocked by the hole transporting layer 5, to the anode 3 side and pass the same.

The average thickness of such a hole transporting layer 5 is not particularly limited and is preferably about 10 nm to about 90 nm and more preferably about 30 nm to about 70 nm.

Electron Transporting Properties of Hole Injecting Layer and Hole Transporting Layer Herein, the electron transporting materials contained in the hole injecting layer 4 and the hole transporting layer 5 are described in detail.

In the light emitting element 1 of this embodiment, the functional layer 45 containing the hole injecting layer 4 and the hole transporting layer 5 is an organic layer which is provided between the anode 3 and the light emitting layer 6 in contact therewith and has a function of transporting holes.

The hole injecting layer 4 and the hole transporting layer 5 each contain an electron transporting material. More specifically, the organic layer containing the functional layers 45 containing the hole injecting layer 4 and the hole transporting layer 5 is constituted including the electron transporting material having electron transporting properties.

Thus, the deterioration of the hole injecting layer 4 and the hole transporting layer 5 by electrons can be prevented while achieving good hole injection properties and hole transporting properties from the anode 3.

More specifically, in such a light emitting element 1, the functional layer (organic layer) 45 containing the hole injecting layer 4 and the hole transporting layer 5 can efficiently transport holes to the light emitting layer 6 from the anode 3. Therefore, the light emitting efficiency of the light emitting element 1 can be increased.

In particular, in the light emitting element 1, the functional layer 45 containing the hole injecting layer 4 and the hole transporting layer 5 contains an electron transporting material and is in contact with each of the anode 3 and the light emitting layer 6. Therefore, even when electrons enter (even when injected into) the hole transporting layer 5 from the light emitting layer 6, the hole injecting layer 4 and the hole transporting layer 5 can promptly transport the electrons to the anode 3 side and pass the same. Thus, the electrons can be prevented from staying in the hole injecting layer 4 and the hole transporting layer 5, and, as a result, the deterioration of the hole injecting layer 4 and the hole transporting layer 5 by the electrons can be prevented. Therefore, even when driving at a current having a high current density, an extension of the lifetime of the light emitting element 1 can be achieved.

As described above, when electrons pass through the inside of the hole injecting layer 4 or the hole transporting layer 5, the electron transporting materials in the hole injecting layer 4 and the hole transporting layer 5 are hardly deteriorated by the electron since the electron transporting materials have high resistance to electrons. Moreover, since the electrons in the hole injecting layer 4 or the hole transporting layer 5 are transported mainly through the electron transporting material rather than the hole transporting material or the hole injecting material, the hole injecting material in the hole injecting layer 4 and the hole transporting material in the hole transporting layer 5 can be prevented from being deteriorated by the electrons.

The electron transporting materials contained in the hole injecting layer 4 and the hole transporting layer 5 are not particularly limited insofar as the material has electron transporting properties, and known electron transporting materials can be used. For example, acene-based materials, quinoline derivatives, such as organic metal complexes having 8-quinolinol or a derivative thereof, such as tris(8-quinolinolato) aluminium ($Alq_3$), as the ligands, azaindolizine derivatives, oxadiazole derivatives, perylene derivatives, pyridine derivatives, pyrimidine derivatives, quinoxaline derivatives, diphenylquinone derivatives, nitro-substituted fluorene derivatives, and the like are mentioned. These substances can be used singly or in combination of two or more kinds thereof.

Among the above, the electron transporting materials each contained in the hole injecting layer 4 and the hole transporting layer 5 are preferably acene-based materials.

The acene-based materials have excellent electron transporting properties and also have hole transporting properties. Therefore, the hole injecting layer 4 or the hole transporting layer 5 containing the acene-based material can promptly transport the electrons from the light emitting layer 6 to the anode 3. Moreover, the acene-based materials have excellent resistance to electrons and holes. Therefore, the deterioration of the hole injecting layer 4 or the hole transporting layer 5 by electrons and holes can be prevented or suppressed.

Such acene-based materials are not particularly limited insofar as the materials have an acene skeleton and demonstrate the above-described effects. For example, naphthalene derivatives, anthracene derivatives, naphthacene derivatives (tetracene derivatives), pentacene derivatives, hexacene derivatives, heptacene derivatives, and the like are mentioned. These substances can be used singly or in combination of two or more kinds thereof. It is preferable to use anthracene derivatives and naphthacene derivatives and more preferably to use anthracene derivatives (particularly one having monoanthracene or bis-anthracene as the main skeleton).

The anthracene derivatives have excellent electron transporting properties and also can be easily formed into a film by a vapor deposition method. Therefore, by the use of the anthracene derivative as the acene-based material, the formation of the homogeneous hole injecting layer 4 or the homogeneous hole transporting layer 5 can be facilitated while achieving good electron transporting properties of the hole injecting layer 4 or the hole transporting layer 5.

The hole injecting layer 4 and the hole transporting layer 5 each preferably contain an amine-based material. The amine-based materials have excellent hole transporting properties. Therefore, the functional layer (organic layer) 45 containing the hole injecting layer 4 and the hole transporting layer 5 containing the amine-based materials can promptly transport the holes from the anode 3 to the light emitting layer 6.

In this case, the hole injecting layer 4 and the hole transporting layer 5 each are preferably constituted by a mixed material in which the acene-based material and the amine-based material are mixed. Thus, the balance of the hole transporting properties and the electron transporting properties of the functional layer (organic layer) 45 containing the hole injecting layer 4 and the hole transporting layer 5 can be relatively easily adjusted in a suitable range.

Moreover, as the electron transporting materials contained in the hole injecting layer 4 and the hole transporting layer 5, hydrocarbon compounds (dielectric) containing only a carbon element and a hydrogen element are preferably used. Such compounds have a relatively low dielectric constant and dielectric dissipation factor and have excellent dielectric properties. Moreover, such compounds do not have polar groups, such as a hydroxyl group and a carboxyl group. Therefore, the compounds generally have poor reactivity, are relatively chemically stable, and hardly interact with the hole injecting material or the hole transporting material. Thus, excellent properties of the light emitting element 1 can be maintained over a long period of time.

The electron transporting material contained in the hole transporting layer 5 and the electron transporting material contained in the hole injecting layer 4 may be the same or different from each other.

The glass transition temperature (Tg) of the electron transporting materials contained in the hole injecting layer 4 and the hole transporting layer 5 is preferably as high as possible, and specifically, is preferably 120° C. or higher and more preferably 150° C. or higher. Thus, even when the temperature of the light emitting element 1 becomes high when driving at a current having a high current density, a reduction in the performance of the light emitting element 1 due to the heat can be prevented.

The content of the electron transporting materials each in the hole injecting layer 4 and the hole transporting layer 5 are preferably 30% by weight or more and 70% by weight or lower and more preferably 40% by weight or more and 60% by weight or lower. Thus, the electron transporting properties and the hole transporting properties of the functional layer (organic layer) 45 containing the hole injecting layer 4 and the hole transporting layer 5 can be suitably balanced. When the organic layer has electron blocking properties, the electron blocking properties and the electron transporting properties of the organic layer can be suitably balanced.

In contrast, when the content is lower than the above-mentioned lower limit value, the electron transporting materials in the hole injecting layer 4 and the hole transporting layer 5 are easily excited, so that the electron transporting material itself emits light, which sometimes results in the fact that the light emission spectrum of the entire light emitting element 1 is adversely affected. In contrast, when the content exceeds the above-mentioned upper limit value, the entire thickness of the layers constituting the light emitting element 1 becomes excessively large, so that the drive voltage of the light emitting element 1 tends to increase.

It is preferable that the content of the electron transporting material in the hole injecting layer 4 and the content of the electron transporting material in the hole transporting layer 5 are different from each other.

The content of the electron transporting material in the hole transporting layer 5 is preferably higher (larger) than the content of the electron transporting material in the hole injecting layer 4. Thus, an increase in the drive voltage of the light emitting element 1 due to a reduction in the hole transporting properties can be suppressed while efficiently performing transportation/injection of electrons at the interface of the hole transporting layer 5 and the light emitting layer 6.

The average thickness (total thickness of the hole injecting layer 4 and the hole transporting layer 5) of the functional layer (organic layer) 45 containing the hole injecting layer 4 and the hole transporting layer 5 is preferably 20 nm or more and 100 nm or lower, more preferably 30 or more and 80 nm or lower, and still more preferably 30 nm or more and 70 nm or lower. Thus, the deterioration of the hole injecting layer 4 and the hole transporting layer 5 by electrons can be prevented while suppressing the drive voltage. Moreover, an optical gap capable of favorably extracting light can be easily formed in the light emitting element 1.

In contrast, when the average thickness is lower than the above-mentioned lower limit value, the hole injection properties of the hole injecting layer 4 or the hole transporting properties of the hole transporting layer 5 tend to decrease depending on the thickness, the constituent materials, and the like of the hole injecting layer 4 or the hole transporting layer 5. In contrast, when the average thickness exceeds the above-mentioned upper limit value, the formation of the optical gap becomes difficult, and the drive voltage of the light emitting element 1 tends to increase.

The average thickness of the hole transporting layer 5 is preferably smaller than the average thickness of the hole injecting layer 4. Since the content of the electron transporting material of the hole transporting layer 5 is higher than that of the hole injecting layer 4, the hole mobility becomes low and the drive voltage easily increases. Therefore, by reducing the film thickness of the hole transporting layer 5 to be smaller than the film thickness of the hole injecting layer 4, the increase in the drive voltage can be suppressed as compared with the case where the hole transporting layer 5 has a film thickness equal to or larger than that of the hole injecting layer 4. More specifically, the reduction in the hole transporting properties of the hole injecting layer 4 and the hole transporting layer 5 can be suppressed and the increase in the drive voltage of the light emitting element 1 can be suppressed.

Light Emitting Layer

The light emitting layer 6 emits light by energizing the anode 3 and the cathode 9 described above.

Such a light emitting layer 6 is constituted including a light emitting material.

Such a light emitting material is not particularly limited, and various kinds of fluorescent materials and various kinds of phosphorescent materials can be used singly or in combination of two or more kinds thereof.

Fluorescent materials emitting red fluorescence are not particularly limited. For example, perylene derivatives, such as a tetra-aryl diindenoperylene derivative represented by Formula (3), europium complexes, benzopyran derivatives, rhodamine derivatives, benzo thioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizine-9-yl)ethenyl)-4H-pyran-4H-ylidene)propanedinitril (DCJTB), 4-(dicyanomethylene)-2-methyl-6-(p-dimethylaminostyryl)-4H-pyrane (DCM), and the like can be mentioned.

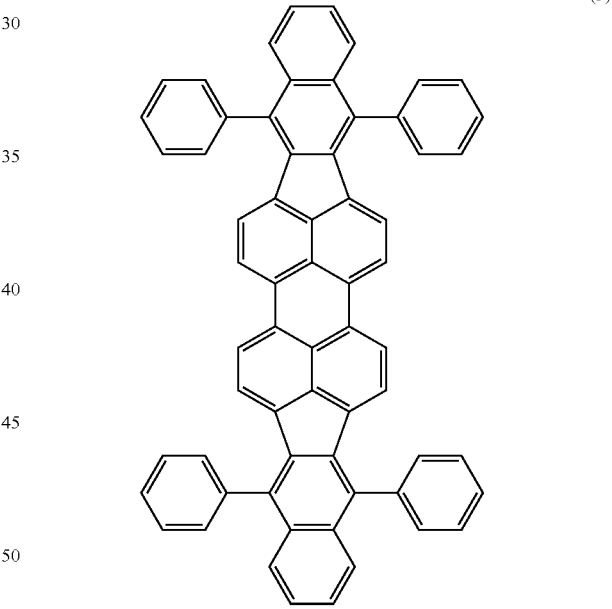

(3)

Phosphorescent materials emitting red phosphorescence are not particularly limited. For example, metal complexes, such as iridium, ruthenium, platinum, osmium, rhenium, and palladium, are mentioned and one in which at least one of ligands of these metal complexes has a phenylpyridine skeleton, a bipyridyl skeleton, a porphyrin skeleton, or the like is also mentioned. More specifically, tris(1-phenylisoquinoline)iridium, bis[2-(2'-benzo[4,5-α]thienyl)pyridinate-N,$C^{3'}$]iridium(acetylacetonate)(btp2Ir(acac)), 2,3,7,8,12,13,17,18-octaethyl-12H,23H-porphyrin-platinum (II), bis[2-(2'-benzo[4,5-α]thienyl)pyridinate-N,$C^{3'}$]iridium, and bis(2-phenylpyridine)iridium(acetylacetonate) are mentioned.

Fluorescent materials emitting blue fluorescence are not particularly limited. For example, distyrylamine derivatives, such as a distyryl diamine-based compound, represented by Formula (4), fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenyl butadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], poly[(9,9-dioctylfluorene-2,7-diyl)-co-(ethynylbenzene)], and the like are mentioned. These substances can be used singly or in combination of two or more kinds thereof.

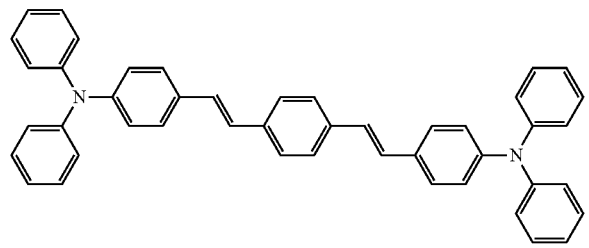

(4)

Phosphorescent materials emitting blue phosphorescence are not particularly limited. For example, metal complexes such as iridium, ruthenium, platinum, osmium, rhenium, and palladium, are mentioned. More specifically, bis[4,6-difluorophenylpyridinate-N,C$^{2'}$]-picolinate-iridium, tris[2-(2,4-difluorophenyl)pyridinate-N,C$^{2'}$]iridium, bis[2-(3,5-trifluoromethyl)pyridinate-N,C$^{2'}$]-picolinate-iridium, and bis(4,6-difluorophenylpyridinate-N,C$^{2'}$)iridium(acetylacetonate) are mentioned.

Fluorescent materials emitting green fluorescence are not particularly limited. For example, coumarin derivatives, quinacridone and a derivative thereof, such as quinacridone derivatives, represented by Formula (5), 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-[(2-ethylhexyloxy) benzene)], poly[(9,9-dioctyl-2,7-divinylenefluorenylene)-alt-co-(2-methoxy-5-(2-ethoxy]hexyloxy)-1,4-phenylene)], and the like are mentioned. These substances can be used singly or in combination of two or more kinds thereof.

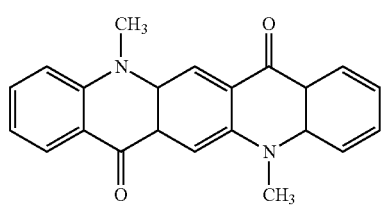

(5)

Phosphorescent materials emitting green phosphorescence are not particularly limited. For example, metal complexes, such as iridium, ruthenium, platinum, osmium, rhenium, and palladium, are mentioned. Among the above, one in which at least one of the ligands of the metal complexes has a phenylpyridine skeleton, a bipyridyl skeleton, a porphyrin skeleton, or the like is preferable. More specifically, fac-tris(2-phenylpyridine)iridium(Ir(ppy)$_3$), bis(2-phenylpyridinate-N, C$^{2'}$)iridium(acetylacetonate), and fac-tris[5-fluoro-2-(5-trifluoromethyl-2-pyridinyl)phenyl-C,N]iridium are mentioned.

Fluorescent materials emitting yellow fluorescence are not particularly limited. For example, compounds having a naphthacene skeleton, such as rubrene-based materials, compounds obtained by substituting arbitrary number (preferably 2 to 6) of aryl groups (preferably phenyl groups) at arbitrary positions in naphthacene, mono-indenoperylene derivatives, and the like can be used.

Such light emitting materials (fluorescent materials or phosphorescent materials) can be used singly or in combination of two or more kinds thereof. When two or more kinds of the light emitting materials are used in combination, the light emitting layer 6 may be a laminate in which a plurality of layers (light emitting layers) different in the light emitting material contained therein are laminated or may be a layer constituted by a mixed material in which two or more kinds of the light emitting materials are mixed. When the light emitting layer 6 is constituted by a plurality of light emitting layers, a layer (intermediate layer) which does not contribute to light emission may be interposed between the light emitting layers.

As the constituent materials of the light emitting layer 6, host materials to which the light emitting materials are added (supported) as a guest material (dopant) may be used in addition to the light emitting materials mentioned above. The host materials have functions of recombining holes and electrons to generate excitons and moving the energy of the excitons to the light emitting materials (Foerster transition or Dexter transition) to excite the light emitting materials. Such host materials can be used by doping the light emitting materials, which are guest materials, as a dopant in the host materials, for example.

Such host materials are not particularly limited insofar as the materials demonstrate the above-described functions to the light emitting materials to be used. When the light-emitting materials contain fluorescent materials, distyrylarylene derivatives, naphthalene derivatives, compounds represented by Formula (6), anthracene derivatives, such as 2-t-butyl-9, 10-di(2-naphthyl)anthracene (TBADN), perylene derivatives, distyrylbenzene derivatives, distyrylamine derivatives, quinolinolato-based metal complexes, such as tris(8-quinolinolato)aluminum complex (Alq$_3$), triarylamine derivatives, such as a tetramer of triphenylamine, oxadiazole derivatives, rubrene and a derivative thereof, such as a compound represented by Formula (7), silole derivatives, dicarbazole derivatives, oligothiophene derivatives, benzopyrene derivatives, triazole derivatives, benzoxazole derivatives, benzothiazole derivatives, quinoline derivatives, and 4,4'-bis(2,2'-diphenylvinyl)biphenyl (DPVBi), and the like are mentioned. These substances can be used singly or in a combination of two or more kinds thereof.

(6)

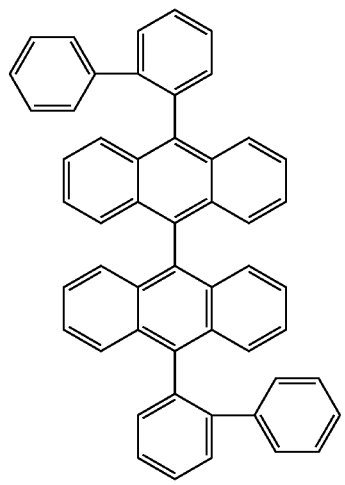

(7)

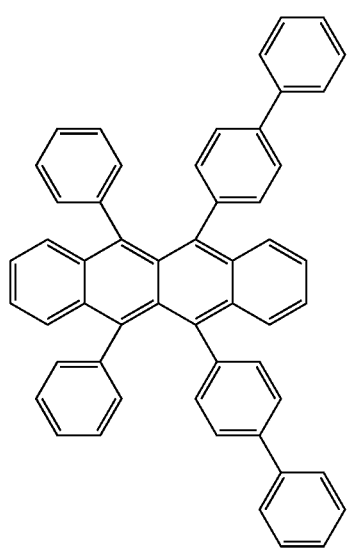

When the light-emitting materials contain phosphorescent materials, examples of a first host material include carbazole derivatives, such as 3-phenyl-4-(1'-naphtyl)-5-phenylcarbazole and 4,4'-N,N'-dicarbazole biphenyl (CBP). These substances can be used singly or in a combination of two or more kinds thereof.

When the light emitting layer 6 contains a host material, the content (doping amount) of the light emitting material in the light emitting layer 6 is preferably 0.01% by weight to 20% by weight and more preferably 0.1% by weight to 10% by weight. By adjusting the content of the light-emitting material in such a range, the light emitting efficiency can be optimized.

The average thickness of the light emitting layer 6 is not particularly limited and is preferably about 1 nm to about 60 nm and more preferably about 3 nm to about 50 nm.

Electron Transporting Layer

The electron transporting layer 7 has a function of transporting the electrons injected from the cathode 9 through the electron injecting layer 8 to the light-emitting layer 6.

Mentioned as the constituent material (electron transporting material) of the electron transporting layer 7 are quinoline derivatives, such as organic metal complexes having 8-quinoline or a derivative thereof, such as tris(8-quinolinolato)aluminum (Alq$_3$), as the ligands, azaindolizine derivative, such as a compound represented by Formula (9), oxadiazole derivatives, perylene derivatives, pyridine derivatives, pyrimidine derivatives, quinoxaline derivatives, diphenylquinone derivatives, and nitro-substituted fluorene derivatives. These substances can be used singly or in combination of two or more kinds thereof.

(8)

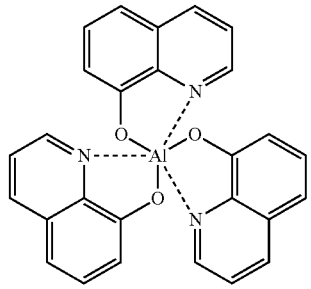

(9)

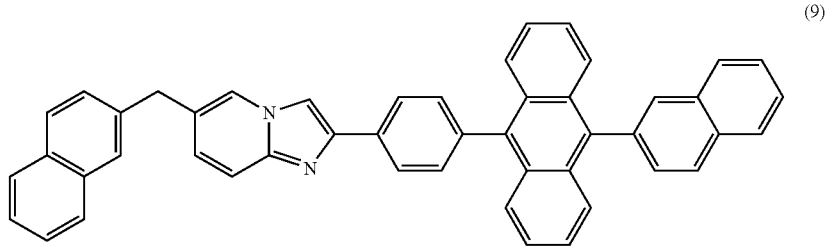

When two or more kinds of the above-mentioned electron transporting materials are used in combination, the electron transporting layer 7 may be constituted by a mixed material in which two or more kinds of the electron transporting materials are mixed and may be constituted by laminating a plurality of layers containing different electron transporting materials.

When the electron transporting layer 7 is constituted by laminating a plurality of layers containing different electron transporting materials, the constituent material of the layer (first electron transporting layer) at the anode side may be a material capable of injecting electrons into the light emitting layer 6. For example, anthracene derivatives, quinoline derivatives, such as organic metal complexes having 8-quinolinole or a derivative thereof, such as tris(8-quinolinolato) aluminum ($Alq_3$) as the ligands, and the like are preferably used. As the constituent material of the layer (a second electron transporting layer) at the cathode side may be a material which allows the electron injecting layer 8 to accept electrons and to inject electrons into the first electron transporting layer. For example, azaindolizine derivatives, such as a compound represented by Formula (9), pyridine derivatives, phenanthrene derivatives, and the like are preferably used.

The average thickness of the first electron transporting layer described above is preferably smaller than the average thickness of the electron transporting layer and is more preferably 0.1 times or more and 0.4 times or lower the average thickness of the second electron transporting layer. Thus, good electron transporting properties and electron injecting properties of the electron transporting layer 7 can be achieved.

The average thickness of the electron transporting layer 7 is not particularly limited and is preferably about 0.5 nm to about 100 nm and more preferably about 1 nm to about 50 nm.

Electron Injecting Layer

The electron injecting layer 8 has a function of increasing the electron injecting efficiency from the cathode 9.

As the constituent material (electron injecting material) of the electron injecting layer 8, various kinds of inorganic insulating materials and various kinds of inorganic semiconductor materials are mentioned.

Mentioned as such inorganic insulating materials are, for example, alkali metal chalcogenides (oxides, sulfides, selenides, and tellurides), alkali earth metal chalcogenides, halides of alkali metals, halides of alkali earth metals, and the like. These substances can be used singly or in combination of two or more kinds thereof. By constituting the electron injecting layer 8 using these inorganic insulating materials as the main material, the electron injection properties can be further increased. In particular, the alkali metal compounds (such as alkali metal chalcogenides and halides of alkali metals) have very low work functions. Therefore, the light-emitting element 1 can obtain high luminance by constituting the electron injecting layer 8 using the alkali metal compounds.

Mentioned as the alkali metal chalcogenides are, for example, $Li_2O$, $LiO$, $Na_2S$, $Na_2Se$, $NaO$, and the like.

Mentioned as the alkali earth metal chalcogenides are, for example, $CaO$, $BaO$, $SrO$, $BeO$, $BaS$, $MgO$, $CaSe$, and the like.

Mentioned as the halides of alkali metals are, for example, $CsF$, $LiF$, $NaF$, $KF$, $LiCl$, $KCl$, $NaCl$, and the like.

Mentioned as the halides of alkali earth metals are, for example, $CaF_2$, $BaF_2$, $SrF_2$, $MgF_2$, $BeF_2$, and the like.

Mentioned as the inorganic semiconductor materials are, for example, oxides, nitrides, oxynitrides, and the like each containing at least one element of Li, Na, Ba, Ca, Sr, Yb, Al, Ga, In, Cd, Mg, Si, Ta, Sb, and Zn. These substances can be used singly or in combination of two or more kinds thereof.

The average thickness of the electron injecting layer 8 is not particularly limited and is preferably about 0.1 nm to about 500 nm, more preferably about 0.2 nm to about 100 nm, and still more preferably about 0.2 nm to about 10 nm.

Sealing Member

The sealing member 10 is provided in such a manner as to cover the anode 3, the laminate 14, and the cathode 9 and has a function of hermetically sealing them to block them from oxygen and moisture. By providing the sealing member 10, effects, such as an increase in reliability of the light emitting element 1 and prevention of degradation and deterioration (an increase in durability) can be achieved.

As the constituent material of the sealing member 10, Al, Au, Cr, Nb, Ta, and Ti, or alloys containing the same, silicon oxides, various types of resin materials, and the like can be mentioned. When a material having conductivity is used as the constituent material of the sealing member 13, an insulating film is preferably provided between the sealing member 10 and the anode 3, the laminate 14, and the cathode 9, as required, in order to avoid a short circuit.

The sealing member 10 may be disposed facing the substrate 2 as a plate-like shape and a sealing material, such as a thermosetting resin, may seal therebetween.

According to the light emitting element 1 configured as described above, the functional layer (organic layer) 45 containing the hole injecting layer 4 and the hole transporting layer 5 can efficiently transport holes to the light emitting layer 6 from the anode 3. Therefore, the light emitting efficiency of the light emitting element 1 can be increased.

In particular, in the light emitting element 1, the functional layer 45 containing the hole injecting layer 4 and the hole transporting layer 5 contains an electron transporting material and is in contact with each of the anode 3 and the light emitting layer 6. Therefore, even when electrons enter (even when injected into) the hole transporting layer 5 from the light emitting layer 6, the hole injecting layer 4 and the hole transporting layer 5 can promptly transport the electrons to the anode 3 side and pass the same. Thus, electrons can be prevented from staying in the hole injecting layer 4 and the hole transporting layer 5, and, as a result, the deterioration of the hole injecting layer 4 and the hole transporting layer 5 by electrons can be prevented. Moreover, by increasing the content of the electron transporting material in the hole transporting layer 5 to be larger than the content of the electron transporting material in the hole injecting layer 4, a deterioration of the hole transporting layer 5 by electrons can be effectively suppressed. Therefore, even when driving at a current having a high current density, an extension of the lifetime of the light emitting element 1 can be achieved.

The above light emitting element 1 can be manufactured as follows, for example.

(1) First, a substrate 2 is prepared, and an anode 3 is formed on the substrate 2.

The anode 3 can be formed by, for example, a chemical vapor deposition (CVD) method, such as plasma CVD or thermal CVD, a dry-plating method, such as vacuum vapor deposition, a wet-plating method, such as electroplating, a spattering method, a thermal spraying method, a sol-gel method, an MOD method, adhesion of metal foil, or the like.

(2) Next, a hole injecting layer 4 is formed on the anode 3.

The hole injecting layer 4 can be formed by, for example, a gas phase method employing, a CVD method or a dry-plating method, such as vacuum vapor deposition or sputtering.

Alternatively, the hole injecting layer 4 may also be formed by, for example, supplying a hole injecting layer-forming material in which a hole-injecting material is dissolved in a solvent or dispersed in a dispersion medium onto the anode 3, and then performing drying (removing the solvent or removing the dispersion medium).

As a method for supplying the hole injecting layer-forming material, various coating methods, such as spin coating, roll coating, or ink jet printing, can also be used. By employing such a coating method, the hole injecting layer 4 can be relatively easily formed.

As the solvent or the dispersion medium for use in the preparation of the hole injecting layer-forming material, various kinds of inorganic solvents, various kinds of organic solvents, a mixed solvent containing the same, or the like can be mentioned.

The drying can be performed by, for example, being left standing under atmospheric or reduced pressure, heating treatment, or spraying inert gas.

Furthermore, prior to this process, the upper surface of the anode 3 may be subjected to oxygen plasma treatment. Thus, the upper surface of the anode 3 can be imparted with a lyophilic property, organic substances attaching onto the upper surface of the anode 3 can be removed (washed off), and the work function near the upper surface of the anode 3 can be controlled, for example.

Herein, the conditions for the oxygen plasma treatment are preferably, for example, a plasma power of about 100 W to about 800 W, an oxygen gas flow rate of about 50 mL/min to about 100 mL/min, a feeding rate of a member to be treated (anode 3) of about 0.5 mm/sec to about 10 mm/sec, and a temperature of the substrate 2 of about 70° C. to about 90° C.

(3) Next, a hole transporting layer 5 is formed on the hole injecting layer 4.

The hole transporting layer 5 can be formed by, for example, a gas phase method employing a CVD method, a dry plating method, such as vacuum vapor deposition or sputtering, or the like.

Alternatively, the hole transporting layer 5 can be formed by supplying a hole transporting layer forming material in which a hole transporting material is dissolved in a solvent or dispersed in a dispersion medium onto the hole injecting layer 4, and then performing drying (removing the solvent or removing the dispersion medium).

(4) Next, a light emitting layer 6 is formed on the hole transporting layer 5.

The light-emitting layer 6 can be formed by, for example, a gas phase method employing a dry plating method, such as vacuum vapor deposition, or the like.

(5) Next, an electron transporting layer 7 is formed on the light emitting layer 6.

The electron transporting layer 7 can be formed by, for example, a gas phase method employing a dry plating method, such as vacuum vapor deposition, or the like.

(6) Next, an electron injecting layer 8 is formed on the electron transporting layer 7.

When an inorganic material is used as the constituent material of the electron injecting layer 8, the electron injecting layer 8 can be formed by, for example, a gas phase method employing a CVD method, a dry plating method, such as vacuum vapor deposition or sputtering, or the like, or by application and burning of an inorganic fine particle ink.

(7) Next, a cathode 9 is formed on the electron injecting layer 8.

The cathode 9 can be formed by, for example, vacuum vapor deposition, sputtering, adhesion of metal foil, application and burning of a metal fine particle ink, or the like.

Next, a sealing member 10 is disposed in such a manner as to cover the anode 3 and the laminate 14 obtained by the above-described processes, and the substrate 2 is attached thereto, whereby the light emitting element 1 is obtained.

The light emitting elements 1 described above each can be used for, for example, light emitting devices, such as the light source for exposure heads of printers employing an electrophotographic system, copying machines, facsimile machines, and the like, the light source for sensors, lighting, the light source for pico projectors (handy projectors), the light source for scanners, and the light source for the front light of reflective liquid crystal display devices. Such light emitting devices have long-life light emitting elements, and therefore have excellent reliability.

By disposing the light emitting elements 1 described above in the shape of a matrix, a display device (the display device of the invention) can be constituted, for example. Such a display device can display a high-definition image over a long period of time and has excellent reliability.

The drive system of the display device is not particularly limited and may be either an active matrix system or a passive matrix system.

An electronic device provided with the light emitting element or the display device of the invention has excellent reliability.

Next, an example of a display apparatus to which the display device of the invention is applied is described below.

Figure 2:
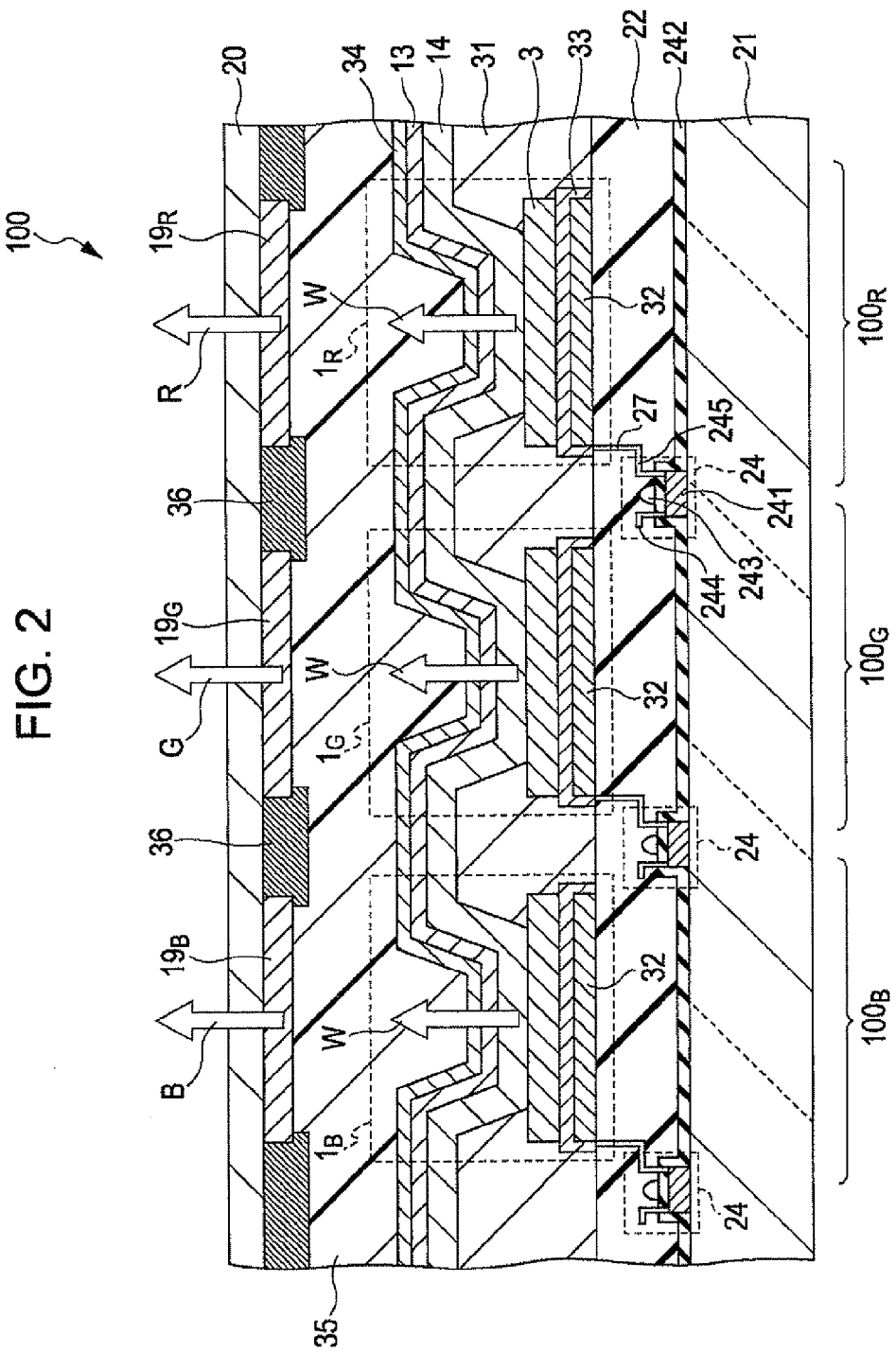
FIG. 2 is a longitudinal cross sectional view illustrating an embodiment of a display device to which the display device of the invention is applied.

FIG. 2 is a longitudinal cross sectional view illustrating an embodiment of the display apparatus to which the display device of the invention is applied.

A display apparatus 100 illustrated in FIG. 2 has a substrate 21, a plurality of light emitting elements $1_R$, $1_G$, and $1_B$ and color filters $19_B$, $19_G$, and $19_B$ provided corresponding to subpixels $100_B$, $100_G$, and $100_B$, respectively, and a plurality of driving transistors 24 for driving each of the light emitting elements $1_R$, $1_G$, and $1_B$. Herein, the display apparatus 100 is a top-emission display panel.

The plurality of the driving transistors 24 are disposed on the substrate 21, and a planarizing layer 22 constituted by an insulating material is disposed in such a manner as to cover the driving transistors 24.

The driving transistors 24 each has a semiconductor layer 241 made of silicon, a gate insulating layer 242 disposed on the semiconductor layer 241, a gate electrode 243 disposed on the gate insulating layer 242, a source electrode 244, and a drain electrode 245.

On the planarizing layer 22, the light emitting elements $1_R$, $1_G$, and $1_B$ are disposed corresponding to the driving transistors 24.

In the light emitting element $1_B$, a reflective layer 32, a corrosion prevention film 33, an anode 3, a laminate (organic EL light emitting portion) 14, a cathode 13, and a cathode cover 34 are laminated in this order on the planarizing layer 22. In this embodiment, the anode 3 of each of the light emitting elements $1_R$, $1_G$, and $1_B$ constitutes an pixel electrode and is electrically connected to the drain electrode 245 of each of the driving transistors 24 via a conductive portion (wiring) 27. The cathode 13 of each of the light emitting elements $1_R$, $1_G$, and $1_B$ is a common electrode.

The light emitting element $1_R$ in FIG. 2 emits white light. For example, the light emitting layer of the light emitting element $1_R$ is constituted by a laminate in which a light emitting layer emitting red light, a light emitting layer emitting blue light, and a light emitting layer emitting green light are laminated or a laminate in which a light emitting layer emitting blue light and a light emitting layer emitting yellow light are laminated.

The light emitting elements $1_G$ and $1_B$ each have the same configuration as that of the light emitting element $1_R$. In FIG.

2, the same configurations as those of FIG. 1 are denoted by the same reference numerals. The configurations (characteristics) of the reflective layers 32 may be different from one another among the light emitting elements $1_R$, $1_G$, and $1_B$ according to the light wavelength.

Between the adjacent light emitting elements $1_R$, $1_G$, and $1_B$, a partition wall 31 is disposed. Furthermore, an epoxy layer 35 made of an epoxy resin is disposed on the light emitting elements $1_R$, $1_G$, and $1_B$ in such a manner as to cover them.

The color filters $19_R$, $19_G$, and $19_B$ are disposed on the epoxy layer 35 described above corresponding to the light emitting elements $1_R$, $1_G$, and $1_B$, respectively.

The color filter $19_R$ converts a white light W from the light emitting element $1_R$ to red light. The color filter $19_G$ converts a white light W from the light emitting element $1_G$ to green light. The color filter $19_B$ converts a white light W from the light emitting element $1_B$ to blue light. By using these color filters $19_R$, $19_G$, and $19_B$ in combination with the light emitting elements $1_R$, $1_G$, and $1_B$, a full color image can be displayed.

Between the adjacent color filters $19_R$, $19_G$, and $19_B$, a light-shielding layer 36 is disposed. Thus, unexpected light emission by the subpixels $100_8$, $100_G$, and $100_B$ can be prevented.

Furthermore, a sealing substrate 20 is disposed on the color filters $19_R$, $19_G$, and $19_B$ and the light-shielding layer 36 in such a manner as to cover them.

The display apparatus 100 described above may perform monochromatic display or also can display a color image by selecting the light emitting materials to be used in the light emitting elements $1_R$, $1_G$, and $1_B$.

Such a display apparatus 100 (the display device of the invention) can be installed in various kinds of electronic devices.

Figure 3:
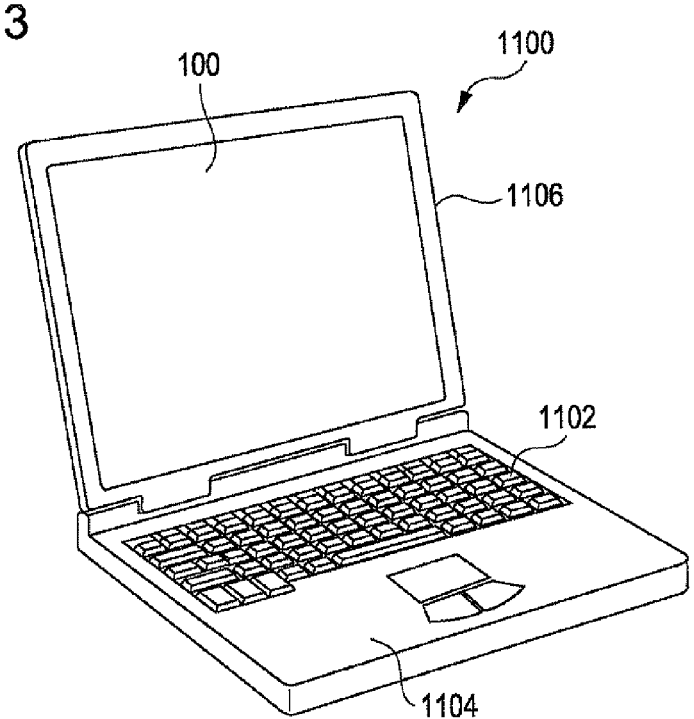
FIG. 3 is a perspective view illustrating the structure of a mobile (or note type) personal computer to which the electronic device of the invention is applied.

FIG. 3 is a perspective view illustrating the structure of a mobile (or note type) personal computer to which the electronic device of the invention is applied.

In FIG. 3, a personal computer 1100 is constituted by a body portion 1104 having a keyboard 1102 and a display unit 1106 having a display portion. The display unit 1106 is rotatably held with respect to the body portion 1104 via a hinge structure portion.

In the personal computer 1100, the display portion of the display unit 1106 is constituted by the above-described display apparatus 100.

Figure 4:
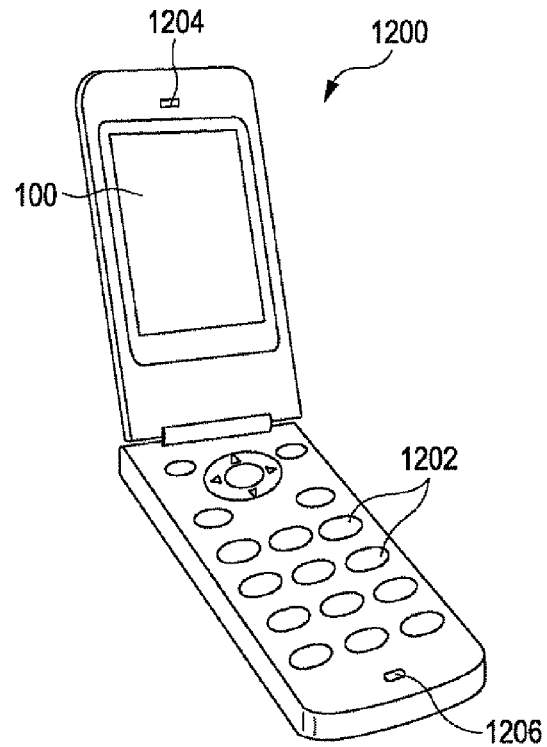
FIG. 4 is a perspective view illustrating the structure of a cellular phone (including PHS) to which the electronic device of the invention is applied.

FIG. 4 is a perspective view illustrating the structure of a cellular phone (including PHS) to which the electronic device of the invention is applied.

In FIG. 4, a cellular phone 1200 has a plurality of operation buttons 1202, an ear piece 1204, a mouthpiece 1206, and also a display portion.

In the cellular phone 1200, the display portion is constituted by the above-described display apparatus 100.

Figure 5:
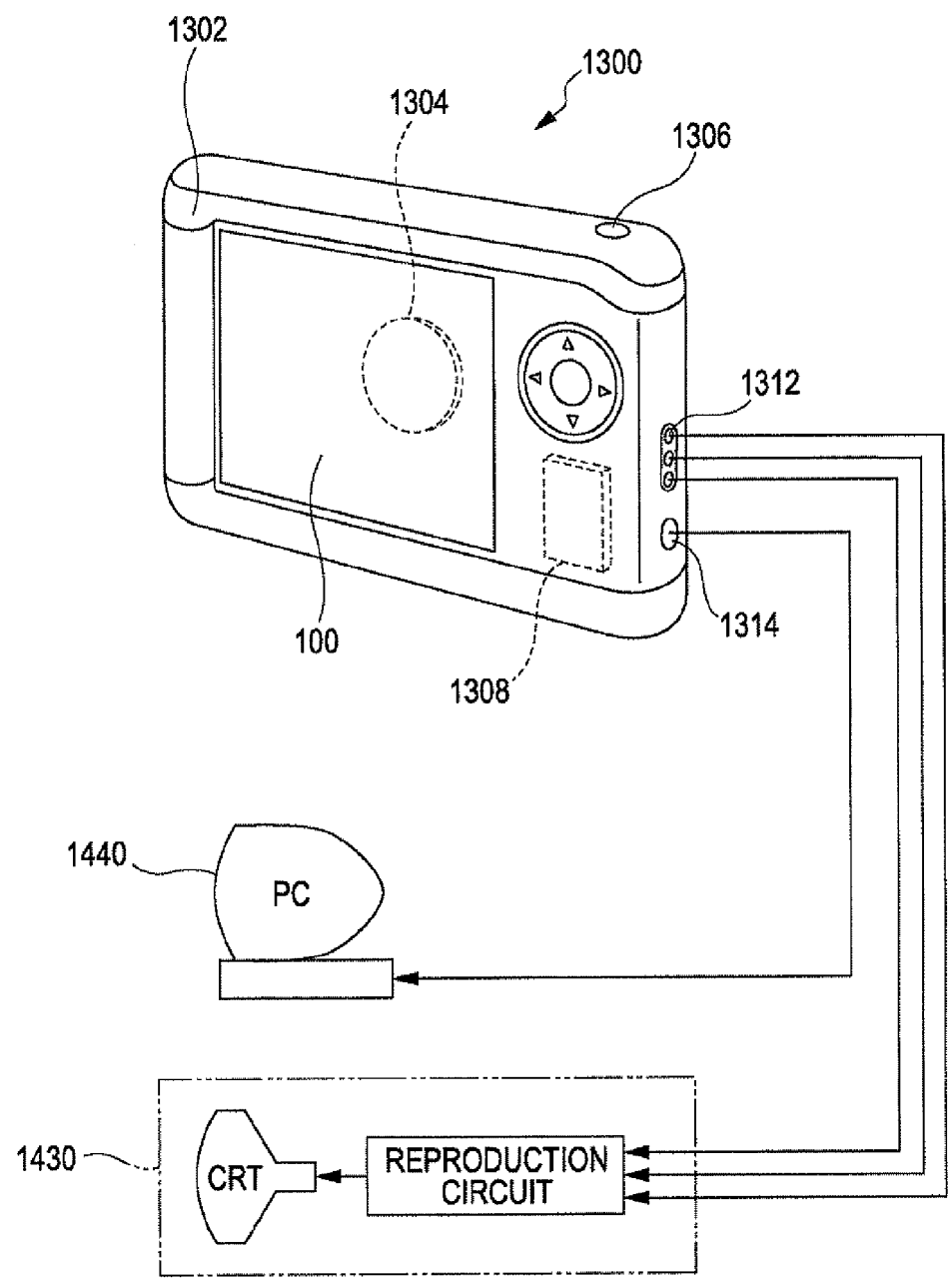
FIG. 5 is a perspective view illustrating the structure of a digital still camera to which the electronic device of the invention is applied.

FIG. 5 is a perspective view illustrating the structure of a digital still camera as the electronic device to which the display device of the invention is applied. In this drawing, connection with an external device is also schematically illustrated.

Herein, a digital still camera 1300 generates an image pickup signal (image signal) by photoelectrical conversion of an optical image of a target object with an image pickup element, such as a charge coupled device (CCD), unlike in usual cameras in which a silver halide photographic film is exposed to an optical image of a target object.

A display portion is provided on the back surface of a case (body) 1302 of the digital still camera 1300. The display portion is configured to display an image according to image pickup signals from the CCD and functions as a finder for displaying a target object as an electronic image.

In the digital still camera 1300, the display portion is constituted by the above-described display apparatus 100.

In the inside of the case, a circuit substrate 1308 is disposed. The circuit substrate 1308 has a memory capable of storing (recording) image pickup signals.

On the front surface (the rear surface side in the structure illustrated in the drawing) of the case 1302, a light-receiving unit 1304 including an optical lens (image pickup optical system), a CCD, and the like is provided.

When a photographer confirms a target object image displayed on the display portion, and then pushes down a shutter button 1306, the image pickup signal of the CCD at that time is transferred to and stored in the memory of the circuit substrate 1308.

In the digital still camera 1300, a video signal output terminal 1312 and a data communication input/output terminal 1314 are provided on the side surface of the case 1302. As illustrated in the drawing, a television monitor 1430 is connected to the video signal output terminal 1312 and a personal computer 1440 is connected to the date communication input/output terminal 1314 as required. Furthermore, it is configured such that an image pickup signal stored in the memory of the circuit substrate 1308 is output to the television monitor 1430 or the personal computer 1440 by a given operation.

The electronic device of the invention can be applied to, in addition to the personal computer (mobile personal computer) illustrated in FIG. 3, the cellular phone illustrated in FIG. 4, and the digital still camera illustrated in FIG. 5, for example, television sets, video cameras, viewfinder type or monitor-direct-view type video tape recorders, laptop type personal computers, car navigation devices, pagers, electronic organizers (including those having communication functions), electronic dictionaries, electronic calculators, electronic game devices, word processors, work stations, visual telephones, security television monitors, electronic binoculars, POS terminals, devices having touch panels (e.g., cash dispensers of financial institutions and automatic ticket vending machines), medical devices (e.g., electronic thermometers, blood-pressure monitors, blood-sugar meters, electrocardiograph displays, ultrasonographs, and endoscope displays), fishfinders, various kinds of measuring instruments, meters and gauges (e.g., meters and gauges of vehicles, aircrafts, and ships), flight simulators, other various kinds of monitors, and projection displays, such as projectors.

As described above, the light emitting element, the light emitting device, the display device, and the electronic device of the invention are described with reference to the embodiments illustrated in the drawings, but the invention is not limited thereto.

EXAMPLES

Next, specific Examples of the invention are described below.

Example 1

(1) First, a transparent glass substrate having an average thickness of 0.5 mm was prepared. Next, an ITO electrode (anode) having an average thickness of 150 nm was formed on the substrate by sputtering.

Then, the substrate was immersed in acetone, and then in 2-propanol for ultrasonic cleansing, followed by oxygen plasma treatment and argon plasma treatment. The plasma treatment was performed at a plasma power of 100 W, a gas flow rate of 20 sccm, and a treatment time of 5 sec in a state where the substrate was warmed to 70° C. to 90° C.

(2) Next, the benzidine derivative (hole injecting material) represented by Formula (1) above and the anthracene derivative (electron transporting material) represented by Formula (10) above were co-deposited on the ITO electrode by vacuum vapor deposition, thereby forming a hole injecting layer having an average thickness of 50 nm.

Herein, the hole injecting layer was constituted by a mixed material of the benzidine derivative (hole transporting material) represented by Formula (1) above and the anthracene derivative (electron transporting material) represented by Formula (10) above. The mixing ratio (weight ratio) was (benzidine derivative):(anthracene derivative)=60:40.

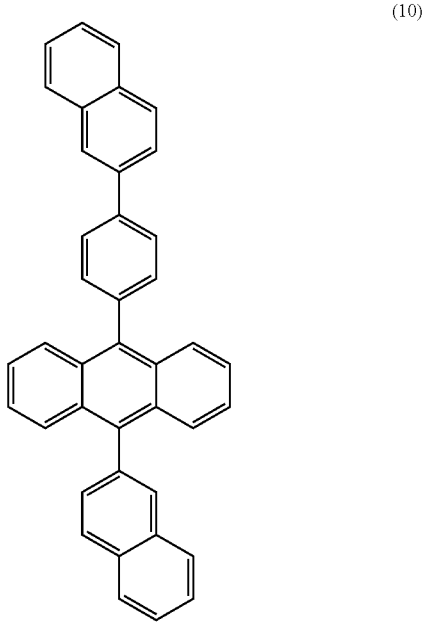 [SMILES: c1ccc2cc(-c3ccc(-c4c5ccccc5c(-c5ccc6ccccc6c5)c5ccccc45)cc3)ccc2c1]

(10)

(3) Next, the benzidine derivative (hole transporting material) represented by Formula (2) above and the anthracene derivative (electron transporting material) represented by Formula (10) above were co-deposited on the hole injecting layer by vacuum vapor deposition, thereby forming a hole transporting layer having an average thickness of 20 nm.

Herein, the hole transporting layer was constituted by a mixed material of the benzidine derivative (hole transporting material) represented by Formula (2) above and the anthracene derivative (electron transporting material) represented by Formula (10) above. The mixing ratio (weight ratio) was (benzidine derivative):(anthracene derivative)=40:60.

(4) Next, the constituent materials of a red light emitting layer were vapor deposited on the hole transporting layer by vacuum vapor deposition, thereby forming a red light emitting layer (light emitting layer) having an average thickness of 40 nm. As the constituent materials of the red light emitting layer, the tetra-aryl diindenoperylene derivative represented by Formula (3) above was used as a red light emitting material (guest material) and the naphthacene derivative represented by Formula (7) above was used as a host material. The content (doping concentration) of the light emitting material (dopant) in the red light emitting layer was 1.0% by weight.

(5) Next, on the red light emitting layer, the tris(8-quinolinolato)aluminum ($Alq_3$) represented by Formula (8) above was formed into a film by vacuum vapor deposition, thereby forming a first electron transporting layer having an average thickness of 5 nm.

(6) Next, on the first electron transporting layer, the azaindolizine derivative represented by Formula (9) above was formed into a film by vacuum vapor deposition, thereby forming a second electron transporting layer having an average thickness of 25 nm.

Thus, an electron transporting layer in which the first electron transporting layer and the second electron transporting layer are laminated was obtained.

(7) Next, lithium fluoride (LiF) was formed into a film by vacuum vapor deposition on the second electron transporting layer of the electron transporting layer, thereby forming an electron injecting layer having an average thickness of 1 nm.

(8) Next, Al was formed into a film by vacuum vapor deposition on the electron injecting layer. Thus, a cathode made of Al having an average thickness of 150 nm was formed.

(9) Next, a glass protection cover (sealing member) was disposed in such a manner as to cover each formed layer, followed by fixation and sealing by an epoxy resin.

A light emitting element was manufactured by the above-described processes.

Example 2

A light emitting element was manufactured in the same manner as in Example 1 described above, except that the mixing ratio (weight ratio) of the benzidine derivative and the anthracene derivative in the hole injecting layer was (Benzidine derivative):(Anthracene derivative)=50:50.

Example 3

A light emitting element was manufactured in the same manner as in Example 1 described above, except that the mixing ratio (weight ratio) of the benzidine derivative and the anthracene derivative in the hole injecting layer was (Benzidine derivative):(Anthracene derivative)=70:30.

Example 4

A light emitting element was manufactured in the same manner as in Example 1 described above, except that the mixing ratio (weight ratio) of the benzidine derivative and the anthracene derivative in the hole transporting layer was (Benzidine derivative):(Anthracene derivative)=30:70.

Example 5

A light emitting element was manufactured in the same manner as in Example 1 described above, except that the average thickness of the hole injecting layer was 20 nm and the average thickness of the hole transporting layer was 50 nm.

Example 6

A light emitting element was manufactured in the same manner as in Example 1 described above, except that the benzidine derivative (hole transporting material) represented by Chemical formula (2) above and the anthracene derivative (electron transporting material) represented by Chemical Formula (10) above were co-deposited by vacuum vapor deposition with (Benzidine derivative):(Anthracene derivative)=60:40, thereby forming a hole injecting layer having an average thickness of 50 nm.

Comparative Example

A light emitting element was manufactured in the same manner as in Example 1 described above, except omitting the compounding of the anthracene derivative (electron transporting material) to the hole injecting layer and the hole transporting layer.

2. Evaluation 2-1. Evaluation of Light Emission Lifetime

With respect to each of the Examples and the Comparative Example, a constant current was continuously applied to the light emitting elements using a direct current source with a current density such that the initial luminosity was 60000 cd/m$^2$ while measuring the luminosity using a luminance meter, the luminosity was measured during the continuous application of a constant current using a luminance meter, and the time (LT90) when the luminosity became 90% of the initial luminosity was measured. Then, the time of LT90 in the Comparative Example was standardized as 1.00, and the time of LT90 of the Comparative Example and each of the Examples was relatively evaluated.

2-2. Evaluation of Light Emission Efficiency

With respect to each of the Examples and the Comparative Example, a constant current was applied to the light emitting elements using a direct current source in such a manner that the luminosity was 60000 cd/m$^2$ while measuring the luminosity using a luminance meter, and the current at that time was measured. The drive voltage applied to the light emitting elements at that time was similarly measured.

2-3. Evaluation of Light Emission Balance

With respect to each of the Examples and the Comparative Example, a constant current was applied to the light emitting elements using a direct current source in such a manner that the luminosity was 60000 cd/m$^2$ while measuring the luminosity using a luminance meter, and the chromaticity at that time was measured using a chromaticity meter.

FIG. 6 is a Table showing the structures of the hole injecting layers and the hole transporting layers in the light emitting elements of the Examples and the Comparative Example and the evaluation results of the light emission properties. The evaluation results are shown in Table 1 of FIG. 6.

As is clear from Table 1, it has been found that the light emitting element of each of the Examples has an extremely long lifetime compared with that of the light emitting element of the Comparative Example. Furthermore, the light emitting element of each of the Examples can be made to emit light with a drive voltage and a current density equivalent to those of the light emitting element of the Comparative Example, and has excellent light emitting efficiency. Moreover, the light emitting elements of Examples 1 to 5 were made to emit light with a chromaticity equivalent to that of the Comparative Example, and a desired light emission color was obtained. In addition, also when the hole injecting layer and the hole transporting layer were constituted by the same material as in Example 6, the same effects as those of Examples 1 to 5 were observed.

This application claims priority from Japanese Patent Application No. 2011-047272 filed in the Japanese patent office on Mar. 4, 2011, the entire disclosure of which is hereby incorporated by reference in its entirely.

What is claimed is:

1. A light emitting element, comprising:
an anode;
a cathode;
a light emitting layer provided between the anode and the cathode; and
an organic layer which is provided between the anode and the light emitting layer and has a function of transporting a hole,
the organic layer having a hole injecting layer which is provided in contact with the anode and contains a hole injecting material and a hole transporting layer which is provided in contact with the hole injecting layer and the light emitting layer and contains a hole transporting material;
the hole injecting layer and the hole transporting layer each containing an electron transporting material having electron transporting properties,
the content of the electron transporting material in the hole injecting layer is different from the electron transport material in the hole transporting layer.

2. The light emitting element according to claim 1, wherein the organic layer has a function of blocking electrons.

3. The light emitting element according to claim 2, wherein the content of the electron transporting material in the hole transporting layer is higher than the content of the electron transporting material in the hole injecting layer.

4. The light emitting element according to claim 3, wherein the average thickness of the hole transporting layer is smaller than the average thickness of the hole injecting layer.

5. The light emitting element according to claim 4, wherein the electron transporting material is an acene-based material.

6. The light emitting element according to claim 5, wherein the organic layer contains an amine-based material.

7. The light emitting element according to claim 6, wherein the organic layer contains a mixed material in which the acene-based material and the amine-based material are mixed.

8. The light emitting element according to claim 5, wherein the acene-based material contains at least one of anthracene-based materials and naphthacene-based materials.

9. The light emitting element according to claim 1, wherein the hole transporting materials contained in the hole injecting layer and the hole transporting layer are the same.

10. The light emitting element according to claim 1, wherein the content of the electron transporting material in the hole injecting layer and the content of the electron transporting material in the hole transporting layer each are 30% by weight or more and 70% by weight or lower.

11. The light emitting element according to claim 1, wherein the average thickness of the organic layer is 20 nm or more and 100 nm or lower.

12. A light emitting device, comprising the light emitting element according to claim 1.

13. A light emitting device, comprising the light emitting element according to claim 2.

14. A light emitting device, comprising the light emitting element according to claim 3.

15. A light emitting device, comprising the light emitting element according to claim 4.

16. A light emitting device, comprising the light emitting element according to claim 5.

17. A light emitting device, comprising the light emitting element according to claim 6.

18. A light emitting device, comprising the light emitting element according to claim 7.

19. A display device, comprising the light emitting device according to claim 12.

20. An electronic device, comprising the display device according to claim 19.

* * * * *